(12) United States Patent
Huang

(10) Patent No.: US 11,824,444 B1
(45) Date of Patent: Nov. 21, 2023

(54) DRIVER CHIP FOR HALF-BRIDGE CIRCUIT

(71) Applicant: Motor Semiconductor Co., Ltd., Hsinchu County (TW)

(72) Inventor: Kuo-Lun Huang, Hsinchu (TW)

(73) Assignee: MOTOR SEMICONDUCTOR CO., LTD., Hsinchu County (TW)

( * ) Notice: Subject to any disclaimer, the term of this patent is extended or adjusted under 35 U.S.C. 154(b) by 0 days.

(21) Appl. No.: 17/875,459

(22) Filed: Jul. 28, 2022

(51) Int. Cl.
*H02M 3/158* (2006.01)
*H02M 3/157* (2006.01)
*H02M 3/335* (2006.01)

(52) U.S. Cl.
CPC ........... *H02M 3/158* (2013.01); *H02M 3/157* (2013.01); *H02M 3/33571* (2021.05)

(58) Field of Classification Search
CPC ..................................................... H02M 3/158
USPC ................................................................ 327/39
See application file for complete search history.

(56) References Cited

U.S. PATENT DOCUMENTS

| 5,825,138 A | * | 10/1998 | Diazzi | .................. | H05B 41/295 |
| | | | | | 315/360 |
| 11,329,635 B1 | * | 5/2022 | Dahlhaus | ............ | H03K 5/00006 |
| 2023/0216342 A1 | * | 7/2023 | Mehas | .................... | H02J 50/80 |
| | | | | | 307/104 |

* cited by examiner

*Primary Examiner* — Tomi Skibinski
(74) *Attorney, Agent, or Firm* — WPAT, P.C

(57) ABSTRACT

A driver chip for a half-bridge circuit includes a drive module and a programming module. The drive module is configured to receive an enabling signal and at least one input signal. The drive module outputs a high-side output signal to a high-side switch and a low-side output signal to a low-side switch, respectively. The programming module includes a decoding unit configured to receive the enabling signal and the at least one input signal. The programming module further includes a preset unit coupled to the decoding unit. The decoding unit outputs decoded data to the preset unit, and the preset unit outputs a circuit parameter.

16 Claims, 5 Drawing Sheets

DRIVER CHIP FOR HALF-BRIDGE CIRCUIT

BACKGROUND OF THE INVENTION

1. Field of the Invention

The present invention relates to an electronic component and, more particularly, to a driver chip for a half-bridge circuit to which programming data can be input for adjusting a circuit parameter and programming.

2. Description of the Related Art

A half-bridge circuit includes a driver chip electrically connected to a high-side switch, a low-side switch, and a power supply. The half-bridge circuit can receive an input signal through the driver chip, and switch the high-side switch and the low-side switch on or off according to a signal level. The input signal may be a pulse width modulation (PWM) signal, used for controlling a switch to alternately turn on the power supply, and can output a square wave signal at a load end electrically connected to the high-side switch and the low-side switch. The half-bridge circuit has the advantages of low costs and easy control.

The half-bridge circuit may further have additional functional components, such as a dead-time control, an under-voltage lockout, an overcurrent protection, an overtemperature protection, and a driver strength control, integrated into the driver chip to increase choices of various conditions for switch control. However, in actual use, the functional components require an additional chip pin to electrically connect to an external electronic component, so as to adjust and program various additional functions by changing electrical parameters of the external electronic component. As a result, there are problems such as the increase in a number of components to be welded to the driver chip, the increase in energy consumption of the overall circuit, and the increase in the complexity of control functions.

In light of the above problems, it is necessary to improve the conventional driver chip for a half-bridge circuit.

SUMMARY OF THE INVENTION

It is therefore an objective of the present invention to provide a driver chip for a half-bridge circuit, which can be switched to a programming mode.

It is another objective of the present invention to provide a driver chip for a half-bridge circuit, which can reduce the number of chip pins and reduce the complexity of a circuit.

It is still another objective of the present invention to provide a driver chip for a half-bridge circuit, which can reduce energy consumption of the chip.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

A driver chip for a half-bridge circuit according to the present invention includes a drive module and a programming module. The drive module is configured to receive an enabling signal and at least one input signal. The drive module outputs a high-side output signal to a high-side switch and a low-side output signal to a low-side switch, respectively. The programming module includes a decoding unit configured to receive the enabling signal and the at least one input signal. The programming module further includes a preset unit coupled to the decoding unit. The decoding unit outputs decoded data to the preset unit, and the preset unit outputs a circuit parameter.

Accordingly, in the driver chip for a half-bridge circuit according to the present invention, by integrating the programming module into the chip, the driver chip can be switched into a programming mode through the enabling signal, and then the input signal originally used for switching the switch is used for decoding, adjusting, and programming the circuit parameter. An additional pin or electrical connection to an external electronic component is not required, leading to effects such as reducing the number of chip pins, reducing the energy consumption of the chip, and reducing the complexity of the half-bridge circuit.

In an example, the drive module includes a control unit, a level shift unit, a high-side drive unit, and a low-side drive unit. The control unit receives the enabling signal and the at least one input signal. The level shift unit and the low-side drive unit are respectively coupled to the control unit. The high-side drive unit is coupled to the level shift unit and the high-side switch. The low-side drive unit is coupled to the low-side switch. Thus, the drive module can convert the input signal into high-voltage and low-voltage control signals to respectively control the high-side drive unit and the low-side drive unit, achieving the effect of driving the high-side and low-side switches.

In an example, when the enabling signal is at a high level, the drive module switches the high-side switch and the low-side switch on or off according to the at least one input signal. Thus, the drive module can switch the switch according to a signal level, achieving the effect of switching to a switch control mode.

In an example, when the enabling signal is at a low level, the drive module switches the high-side switch and the low-side switch off, and the decoding unit decodes programming data in the at least one input signal. Thus, the programming module can be configured to adjust and program the parameter of the circuit function, achieving the effect of switching to a programming mode.

In an example, the drive module and the decoding unit receive two input signals, including a high-side input signal and a low-side input signal. Thus, the drive module can control the high-side drive unit according to the high-side input signal, and can further control the low-side drive unit according to the low-side input signal. The programming module can use the high-side input signal and the low-side input signal as a clock signal and a data signal, respectively, achieving the effect of using the clock signal to sample the programming data in the data signal.

In an example, the drive module receives two input signals, including a high-side input signal and a low-side input signal, and the decoding unit receives one of the high-side input signal and the low-side input signal. Thus, the decoding unit can decode the programming data in one of the two input signals, achieving the effect of activating a single-wire decoding.

In an example, the driver chip for a half-bridge circuit further includes a voltage comparator coupled to the drive module and the decoding unit of the programming module, respectively. The voltage comparator receives the enabling signal. Thus, the voltage comparator can generate a logic level signal to activate the decoding unit or a control circuit, achieving the effect of switching between a switch control mode and a programming mode.

In an example, when an analog voltage of the enabling signal is at a low level or between a high level and the low level, an output signal of the voltage comparator activates the decoding unit to decode programming data in the at least one input signal. Thus, the programming module can be used to adjust and program the parameter of the circuit function, achieving the effect of switching to a programming mode.

In an example, when an analog voltage of the enabling signal is between a high level and a low level, an output signal of the voltage comparator activates the decoding unit to decode programming data in the at least one input signal. Thus, the programming module can be used to adjust and program the parameter of the circuit function, achieving the effect of switching to a programming mode.

In an example, the driver chip for a half-bridge circuit further includes two voltage comparators respectively located in the drive module and the decoding unit of the programming module. The two voltage comparators receive the enabling signal. Thus, the two voltage comparators can generate a logic level signal to activate the decoding unit or a control circuit, achieving the effect of switching between a switch control mode and a programming mode.

A driver chip for a half-bridge circuit according to the present invention receives a first input signal and a second input signal. The driver chip for a half bridge circuit includes a drive module, a programming module, and a voltage comparator. The drive module is configured to receive the first input signal. The drive module outputs a high-side output signal to a high-side switch and a low-side output signal to a low-side switch, respectively. The programming module includes a decoding unit and a preset unit coupled to the decoding unit. The decoding unit receives the first input signal and outputs decoded data to the preset unit, and the preset unit outputs a circuit parameter. The voltage comparator is coupled to the drive module and the decoding unit of the programming module, respectively. The voltage comparator receives the second input signal.

In an example, the drive module includes a control unit, a level shift unit, a high-side drive unit, and a low-side drive unit. The control unit is coupled to the voltage comparator. The control unit receives the first input signal and receives the second input signal through the voltage comparator. The level shift unit and the low-side drive unit are respectively coupled to the control unit. The high-side drive unit is coupled to the level shift unit and the high-side switch. The low-side drive unit is coupled to the low-side switch. Thus, the drive module can control the high-side drive unit and the low-side drive unit, respectively, achieving the effect of driving the high-side and low-side switches.

In an example, when the second signal is at a high level or a low level, the control unit switches the high-side switch on or off according to the first input signal, and switches the low-side switch on or off according to the second input signal. Thus, the drive module can switch the switch according to a signal level, achieving the effect of switching to a switch control mode.

In an example, when the second input signal is an analog voltage between a high level and a low level, the decoding unit decodes programming data in the first input signal. Thus, the programming module can be used to adjust and program the parameter of the circuit function, achieving the effect of switching to a programming mode.

In an example, the first input signal is a high-side input signal and the second input signal is a low-side input signal. Thus, different input signals can be used according to actual needs, achieving the effect of easy control of the half-bridge circuit.

In an example, the first input signal is a low-side input signal and the second input signal is a high-side input signal.

Thus, different input signals can be used according to actual needs, achieving the effect of easy control of the half-bridge circuit.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
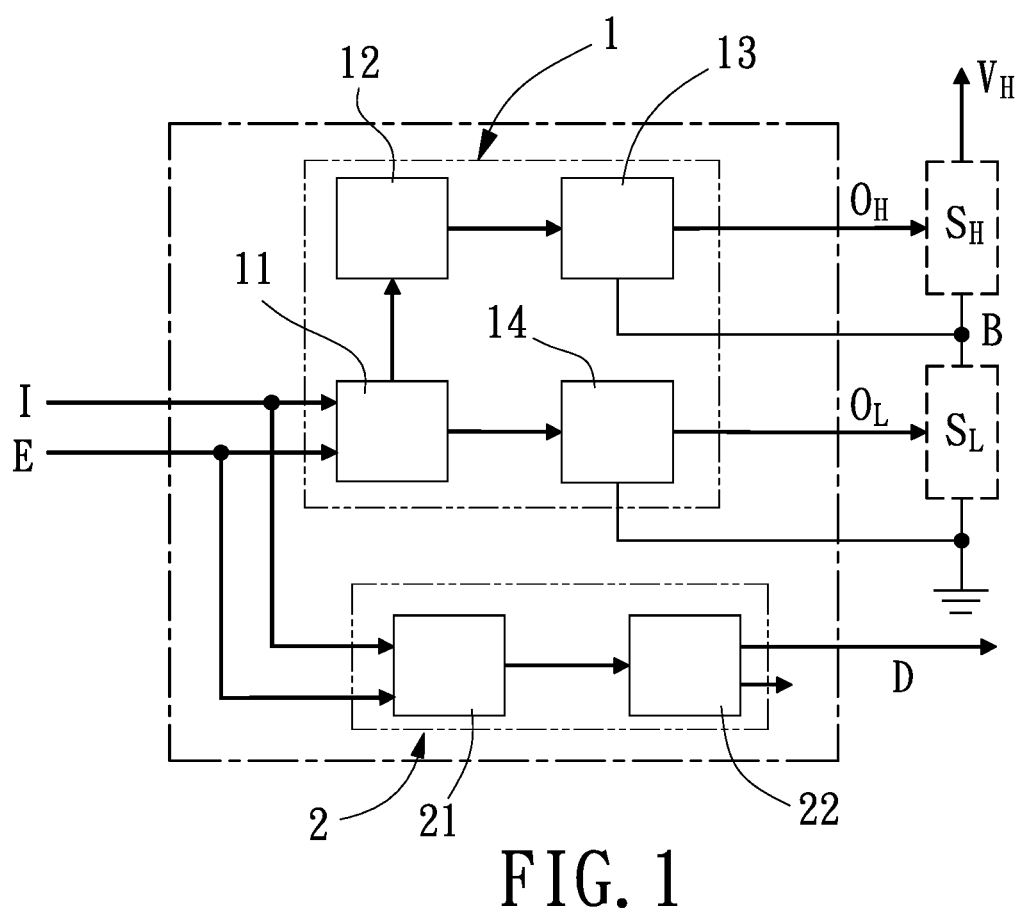
FIG. 1 is a circuit diagram of a first embodiment of the present invention.

In the various figures of the drawings, the same numerals designate the same or similar parts. Furthermore, when the terms "front", "rear", "left", "right", "up (top)", "down (bottom)", "inner", "outer", "side", and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

FIG. 1 shows a first embodiment of a driver chip for a half-bridge circuit of the present invention, including a drive module 1 and a programming module 2. The drive module 1 is coupled to a high-side switch $S_H$ and a low-side switch $S_L$, respectively. The drive module 1 and the programming module 2 receive an enabling signal E and an input signal I. The drive module 1 outputs a high-side output signal $O_H$ to the high-side switch $S_H$ and a low-side output signal $O_L$ to the low-side switch $S_L$, respectively. The programming module 2 outputs a circuit parameter D.

The drive module 1 includes a control unit 11, a level shift unit 12, a high-side drive unit 13, and a low-side drive unit 14. The control unit 11 receives the enabling signal E and the input signal I. The level shift unit 12 and the low-side drive unit 14 are respectively coupled to the control unit 11. The high-side drive unit 13 is coupled to the level shift unit 12 and the high-side switch $S_H$. The low-side drive unit 14 is coupled to the low-side switch $S_L$.

When the enabling signal E is at a high level, the control unit 11 can control the high-side drive unit 13 and the low-side drive unit 14 according to the input signal I. When the input signal I is at a high level, the high-side drive unit 13 switches the high-side switch $S_H$ on, and the low-side drive unit 14 switches the low-side switch $S_L$ Off. When the input signal I is at a low level, the high-side drive unit 13 switches the high-side switch $S_H$ off, and the low-side drive unit 14 switches the low-side switch $S_L$ on. When the enabling signal E is at a low level, the control unit 11 controls the high-side drive unit 13 and the low-side drive unit 14 to switch the high-side switch $S_H$ and the low-side switch $S_L$ off. Further, since the high-side drive unit 13 withstands a higher voltage than the low-side drive unit 14, a control signal provided by the control unit 11 needs to be first translated to a high voltage level by the level shift unit 12, so that the high-side drive unit 13 can be effectively driven to control the high-side switch $S_H$ and the low-side switch $S_L$ to switch on or off.

In addition, one end of the high-side switch $S_H$ is electrically connected to a high-voltage power supply $V_H$, and the other end is electrically connected to a load end B. One end of the low-side switch $S_L$ is electrically connected to the load end B, and the other end thereof is grounded. The load end B can be electrically connected to any load. In this way, the drive module 1 switches the high-side switch $S_H$ and the low-side switch $S_L$ on or off to generate a voltage change at the load end B and supply power to the load.

The programming module 2 receives the enabling signal E and the input signal I through a decoding unit 21. The decoding unit 21 is coupled to a preset unit 22. When the enabling signal E is at a low level, the decoding unit 21 can decode programming data in the input signal I. When the enabling signal E is at a high level or when the transmission of the programming data is completed, the decoding unit 21 outputs decoded data to the preset unit 22, and makes that the decoded data correspond to the preset circuit parameter D. The circuit parameter D may be a parameter for adjusting and programming a circuit function, such as a time delay, a voltage, or a current. The circuit parameter D may be used for a control function inside the driver chip, and may further be used for circuits other than the chip. In this embodiment, the decoding unit 21 is a single-wire decoder.

Figure 2A:
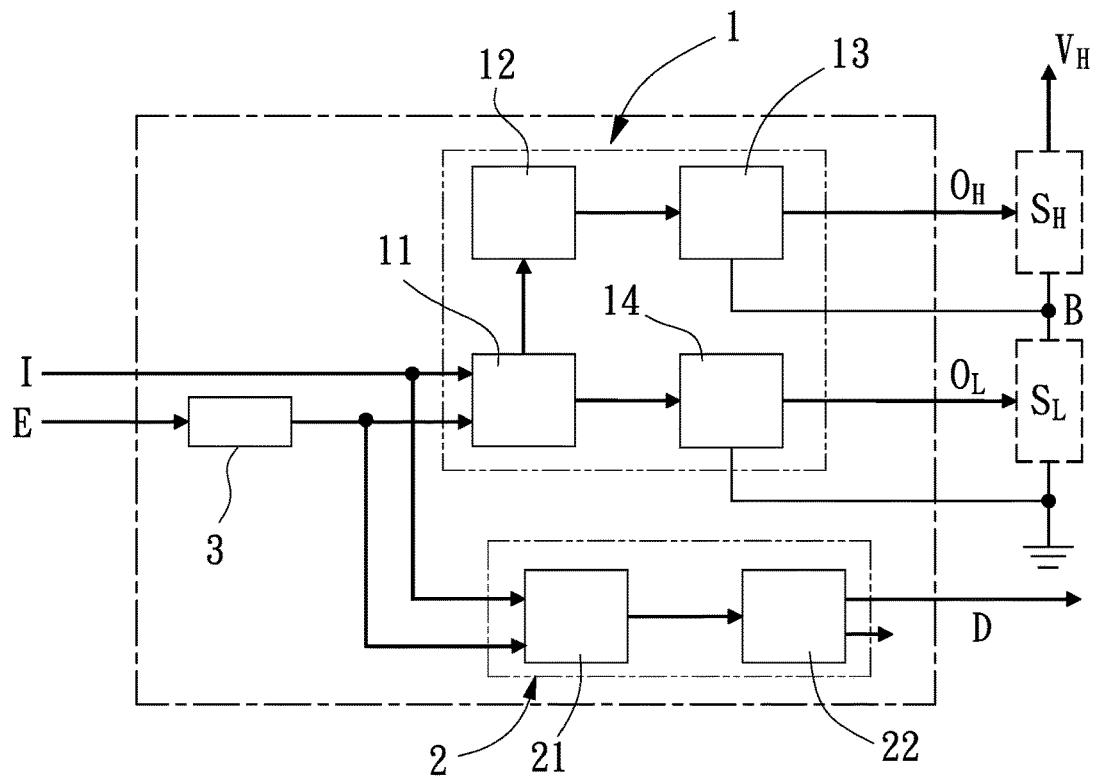
FIG. 2a is another circuit diagram of the first embodiment of the present invention.
Figure 2B:
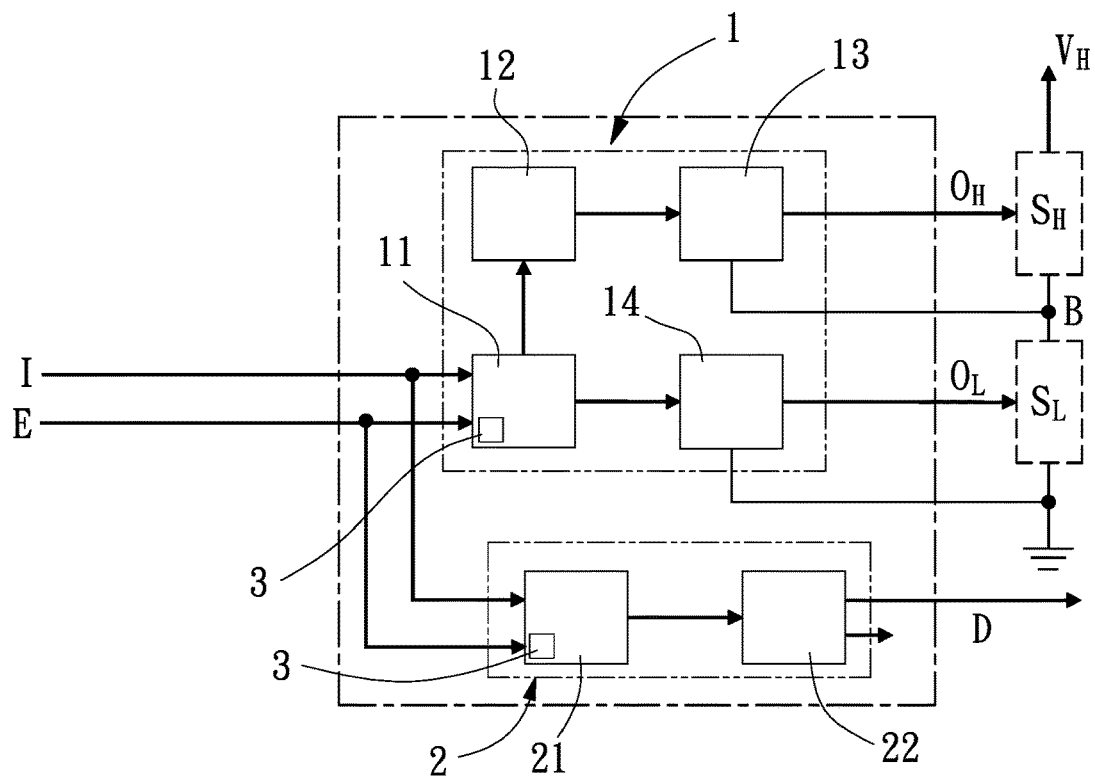
FIG. 2b is still another circuit diagram of the first embodiment of the present invention.

Referring to FIG. 2a, the first embodiment of the driver chip for a half-bridge circuit of the present invention may further include a voltage comparator 3. The voltage comparator 3 is coupled to the control unit 11 of the drive module 1 and the decoding unit 21 of the programming module 2, respectively. The voltage comparator 3 receives the enabling signal E, and the control unit 11 and the decoding unit 21 receive the input signal I. When the enabling signal E is at a high level, an output signal of the voltage comparator 3 activates the control unit 11 to switch the high-side switch $S_H$ and the low-side switch $S_L$ on or off according to the input signal I. When the enabling signal E is not at a high level, an output signal of the voltage comparator 3 activates the decoding unit 21 to decode the programming data in the input signal I. For example, when an analog voltage of the enabling signal E is at a low level or is between a high level and a low level, the voltage comparator 3 can activate the decoding unit 21. Alternatively, only when the analog voltage of the enabling signal E is between a high level and a low level, the decoding unit 21 can be activated. The present invention is not limited in this regard. In addition, as shown in FIG. 2b, the voltage comparator 3 may further be integrated into the control unit 11 and the decoding unit 21, respectively. That is, the control unit 11 and the decoding unit 21 are respectively equipped with one voltage comparator 3 for receiving the enabling signal E.

Figure 3:
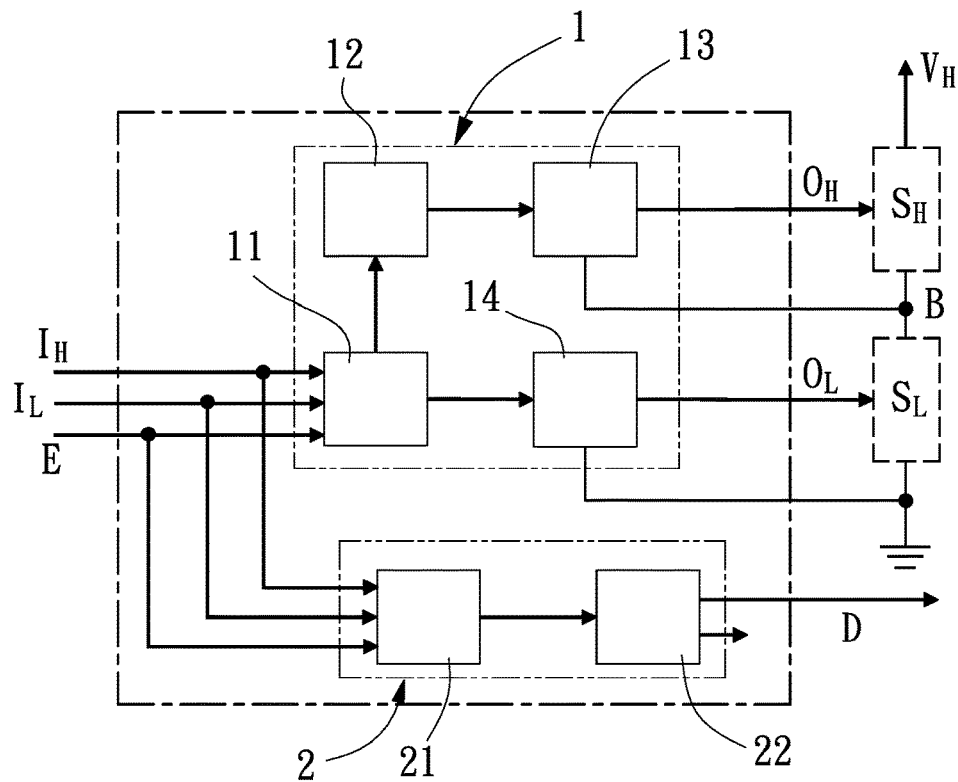
FIG. 3 is a circuit diagram of a second embodiment of the present invention.

FIG. 3 shows a second embodiment of the driver chip for a half-bridge circuit of the present invention. This embodiment is basically the same as the first embodiment described above. In this embodiment, the drive module 1 and the programming module 2 receive the enabling signal E, a high-side input signal $I_H$, and a low-side input signal $I_L$.

The control unit 11 of the drive module 1 receives the enabling signal E, the high-side input signal $I_H$, and the low-side input signal $I_L$. When the enabling signal E is at a high level, the control unit 11 can control the high-side drive unit 13 according to the high-side input signal $I_H$. When the high-side input signal $I_H$ is at a high level, the high-side drive unit 13 switches the high-side switch $S_H$ on, and when the high-side input signal $I_H$ is at a low level, the high-side drive unit 13 switches the high-side switch $S_H$ off. The control unit 11 can further control the low-side drive unit 14 according to the low-side input signal $I_L$. When the low-side input signal $I_L$ is at a high level, the low-side drive unit 14 switches the low-side switch $S_L$ on, and when the low-side input signal $I_L$ is at a low level, the low-side drive unit 14 switches the low-side switch $S_L$ off. When the enabling signal E is at a low level, the control unit 11 controls the high-side drive unit 13 and the low-side drive unit 14 to switch the high-side switch $S_H$ and the low-side switch $S_L$ off.

The decoding unit 21 of the programming module 2 receives the enabling signal E, the high-side input signal $I_H$, and the low-side input signal $I_L$. When the enabling signal E is at a low level, the decoding unit 21 can decode the programming data in the high-side input signal $I_H$ and the low-side input signal $I_L$. One of the high-side input signal $I_H$ or the low-side input signal $I_L$ may be a clock signal, and the other may be a data signal. The decoding unit 21 can use the clock signal to sample the programming data in the data signal. In this embodiment, the decoding unit 21 is a two-wire control unit.

Figure 4:
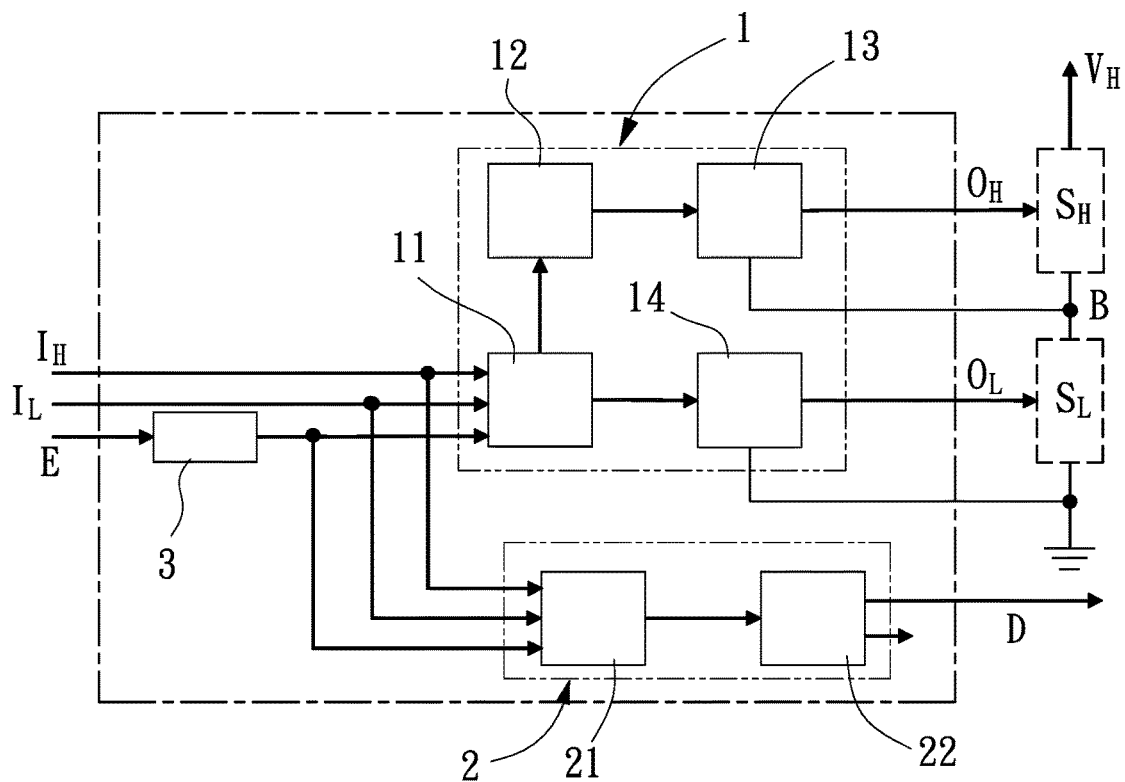
FIG. 4 is another circuit diagram of the second embodiment of the present invention.

Referring to FIG. 4, the second embodiment of the driver chip for a half-bridge circuit of the present invention may further include the voltage comparator 3. The voltage comparator 3 is coupled to the control unit 11 of the drive module 1 and the decoding unit 21 of the programming module 2. The voltage comparator 3 receives the enabling signal E, and the control unit 11 and the decoding unit 21 receive the high-side input signal $I_H$ and the low-side input signal $I_L$. When the enabling signal E is at a high level, an output signal of the voltage comparator 3 activates the control unit 11 to switch the high-side switch $S_H$ on or off according to the high-side input signal $I_H$, and to switch the low-side switch $S_L$ on or off according to the low-side input signal $I_L$. When the enabling signal E is not at a high level, an output signal of the voltage comparator 3 activates the decoding unit 21 to decode the programming data in the high-side input signal $I_H$ and the low-side input signal $I_L$.

Figure 5:
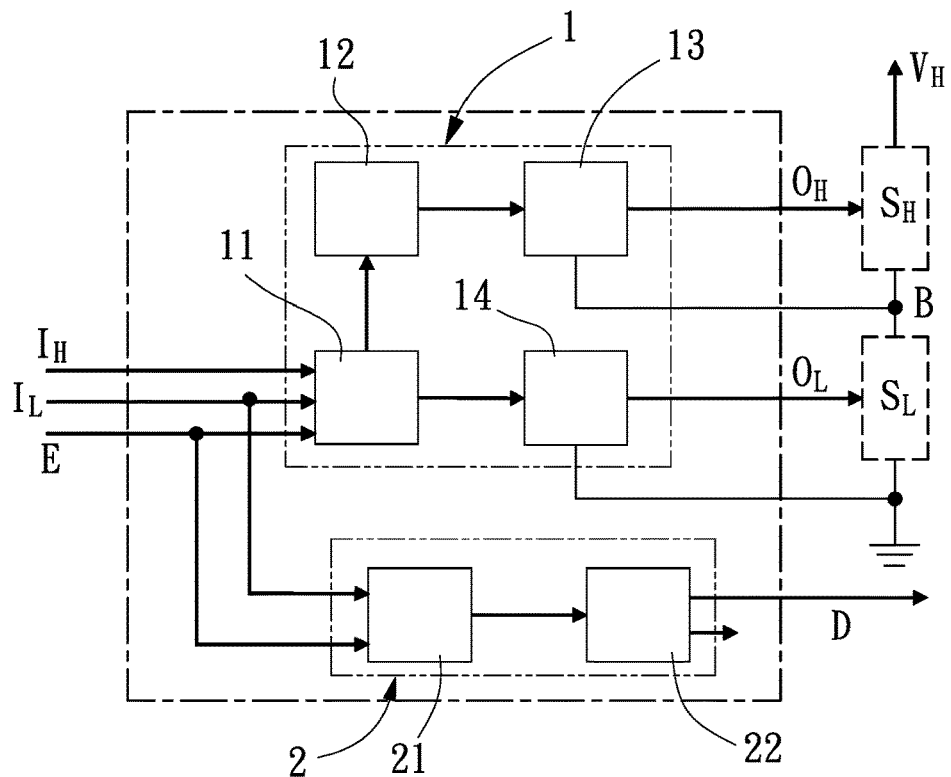
FIG. 5 is a circuit diagram of a third embodiment of the present invention.

FIG. 5 shows a third embodiment of the driver chip for a half-bridge circuit of the present invention. This embodiment is basically the same as the second embodiment described above. In this embodiment, the drive module 1 receives the enabling signal E, the high-side input signal $I_H$, and the low-side input signal $I_L$, and the programming module 2 receives the enabling signal E and the low-side input signal $I_L$. However, the programming module 2 may also choose to receive the high-side input signal $I_H$ instead of the low-side input signal $I_L$. The present invention is not limited in this regard.

The control unit 11 of this embodiment is the same as that of the second embodiment described above, and the decoding unit 21 of this embodiment receives the enabling signal E and the low-side input signal $I_L$. When the enabling signal E is at a low level, the decoding unit 21 can decode the programming data in the low-side input signal $I_L$. In this embodiment, the decoding unit 21 is a single-wire decoder.

Figure 6:
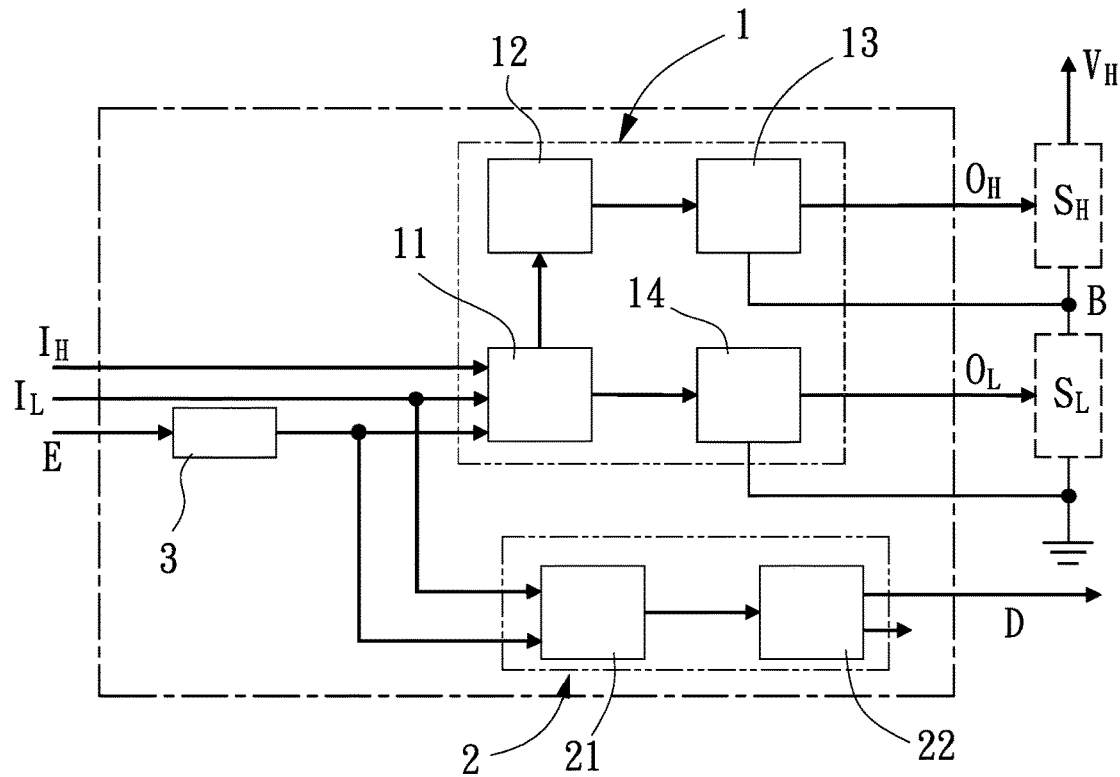
FIG. 6 is another circuit diagram of the third embodiment of the present invention.

Referring to FIG. 6, the third embodiment of the driver chip for a half-bridge circuit of the present invention may further include the voltage comparator 3. The voltage comparator 3 is coupled to the control unit 11 of the drive module 1 and the decoding unit 21 of the programming module 2. The voltage comparator 3 receives the enabling signal E, the control unit 11 receives the high-side input signal $I_H$ and the low-side input signal $I_L$, and the decoding unit 21 receives the low-side input signal $I_L$. When the enabling signal E is at a high level, an output signal of the voltage comparator 3 activates the control unit 11 to switch the high-side switch $S_H$ on or off according to the high-side input signal $I_H$, and to switch the low-side switch $S_L$ on or off according to the low-side input signal $I_L$. When the enabling signal E is not at a high level, an output signal of the voltage comparator 3 activates the decoding unit 21 to decode the programming data in the low-side input signal $I_L$.

Figure 7:
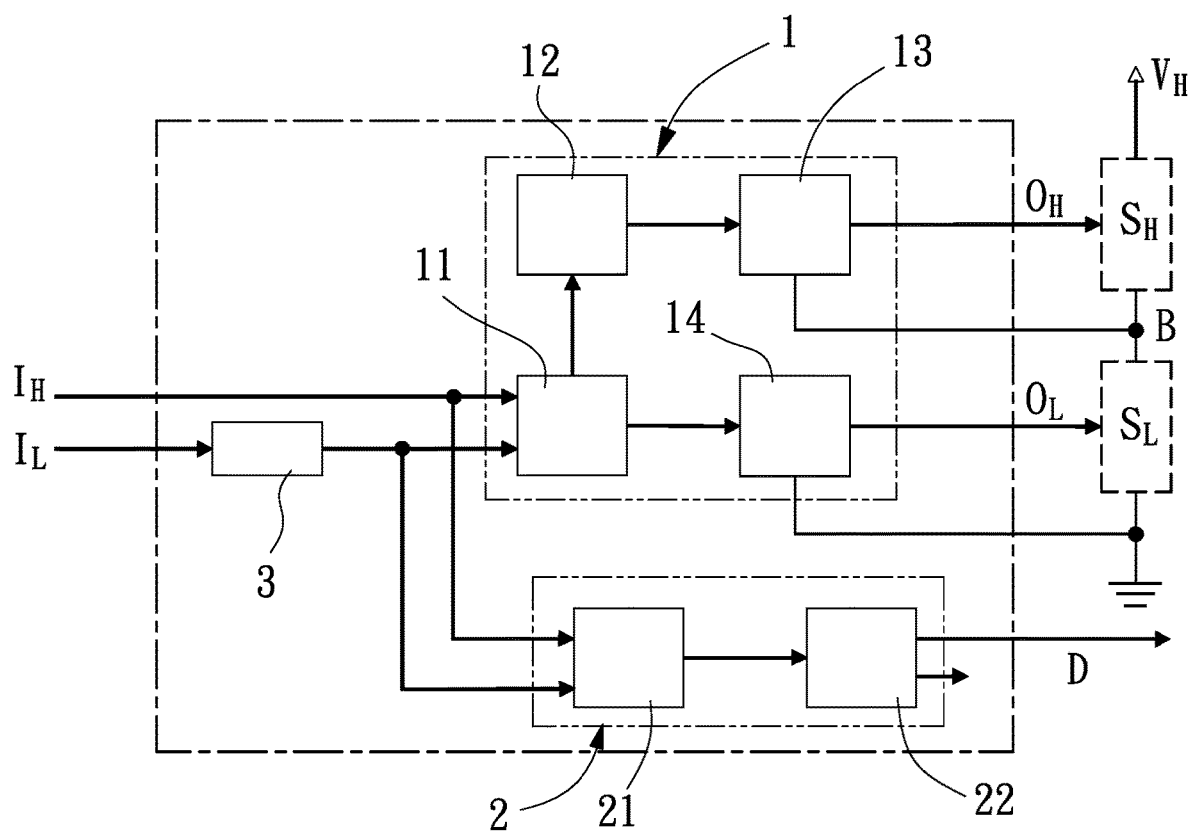
FIG. 7 is a circuit diagram according to a fourth embodiment of the present invention.

FIG. 7 shows a fourth embodiment of the driver chip for a half-bridge circuit of the present invention. This embodiment is basically the same as the first embodiment described above. In this embodiment, the voltage comparator 3 is coupled to the control unit 11 of the drive module 1 and the decoding unit 21 of the programming module 2. The control unit 11 and the decoding unit 21 may receive a first input signal. The voltage comparator 3 may receive a second input signal, as shown in FIG. 7. For illustrating this embodiment, the first input signal is a high-side input signal $I_H$ and the second input signal is a low-side input signal $I_L$. However, optionally the second input signal may be the high-side input signal $I_H$, and the first input signal may be the low-side input signal $I_L$. The present invention is not limited in this regard.

In this embodiment, when the low-side input signal $I_L$ is an analog voltage between a high level and a low level, an output signal of the voltage comparator 3 activates the decoding unit 21 to decode the programming data in the high-side input signal $I_H$. When the low-side input signal $I_L$ is at a high level or at a low level, or when the transmission of the programming data is completed, the decoding unit 21 outputs decoded data to a preset unit 22. When the low-side input signal $I_L$ is at a high level or at a low level, an output signal of the voltage comparator 3 activates the control unit 11 to switch the high-side switch $S_H$ on or off according to the high-side input signal $I_H$, and to switch the low-side switch $S_L$ on or off according to the low-side input signal $I_L$. In this embodiment, the decoding unit 21 is a single-wire decoder.

According to the above, in the driver chip for a half-bridge circuit according to the present invention, by integrating the programming module into the chip, the driver chip can be switched into a programming mode through the enabling signal, and then the input signal originally used for switching the switch is used for decoding, adjusting, and programming the circuit parameter. An additional pin or electrical connection to an external electronic component is not required, leading to effects such as reducing the number of chip pins, reducing the energy consumption of the chip, and reducing the complexity of the half-bridge circuit.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A driver chip for a half-bridge circuit, comprising:
   a drive module, wherein the drive module is configured to receive an enabling signal and at least one input signal, and wherein the drive module outputs a high-side output signal to a high-side switch and a low-side output signal to a low-side switch, respectively; and
   a programming module, wherein the programming module includes a decoding unit configured to receive the enabling signal and the at least one input signal, wherein the programming module includes a preset unit coupled to the decoding unit, and wherein the decoding unit outputs decoded data to the preset unit, and the preset unit outputs a circuit parameter.

2. The driver chip for a half-bridge circuit as claimed in claim 1, wherein the drive module includes a control unit, a level shift unit, a high-side drive unit, and a low-side drive unit, wherein the control unit receives the enabling signal and the at least one input signal, wherein the level shift unit and the low-side drive unit are respectively coupled to the control unit, wherein the high-side drive unit is coupled to the level shift unit and the high-side switch, and wherein the low-side drive unit is coupled to the low-side switch.

3. The driver chip for a half-bridge circuit as claimed in claim 1, wherein when the enabling signal is at a high level, the drive module switches the high-side switch and the low-side switch on or off according to the at least one input signal.

4. The driver chip for a half-bridge circuit as claimed in claim 1, wherein when the enabling signal is at a low level, the drive module switches the high-side switch and the low-side switch off, and the decoding unit decodes programming data in the at least one input signal.

5. The driver chip for a half-bridge circuit as claimed in claim 1, wherein the drive module and the decoding unit receive two input signals, including a high-side input signal and a low-side input signal.

6. The driver chip for a half-bridge circuit as claimed in claim 1, wherein the drive module receives two input signals, including a high-side input signal and a low-side input signal, and the decoding unit receives one of the high-side input signal and the low-side input signal.

7. The driver chip for a half-bridge circuit as claimed in claim 1, further comprising a voltage comparator coupled to the drive module and the decoding unit of the programming module, respectively, wherein the voltage comparator receives the enabling signal.

8. The driver chip for a half-bridge circuit as claimed in claim 7, wherein when an analog voltage of the enabling signal is at a low level or between a high level and the low level, an output signal of the voltage comparator activates the decoding unit to decode programming data in the at least one input signal.

9. The driver chip for a half-bridge circuit as claimed in claim 7, wherein when an analog voltage of the enabling signal is between a high level and a low level, an output signal of the voltage comparator activates the decoding unit to decode programming data in the at least one input signal.

10. The driver chip for a half-bridge circuit as claimed in claim 1, further comprising two voltage comparators respectively located in the drive module and the decoding unit of the programming module, wherein the two voltage comparators receive the enabling signal.

11. A driver chip for a half-bridge circuit, receiving a first input signal and a second input signal, comprising:
   a drive module, wherein the drive module is configured to receive the first input signal, and wherein the drive module outputs a high-side output signal to a high-side switch and a low-side output signal to a low-side switch, respectively;
   a programming module, wherein the programming module includes a decoding unit and a preset unit coupled to the decoding unit, and wherein the decoding unit receives the first input signal and outputs decoded data to the preset unit, and the preset unit outputs a circuit parameter; and a voltage comparator, wherein the voltage comparator is coupled to the drive module and the decoding unit of the programming module, respectively, wherein the voltage comparator receives the second input signal.

12. The driver chip for a half-bridge circuit as claimed in claim 11, wherein the drive module includes a control unit, a level shift unit, a high-side drive unit, and a low-side drive unit, wherein the control unit is coupled to the voltage comparator, wherein the control unit receives the first input signal and receives the second input signal through the voltage comparator, wherein the level shift unit and the low-side drive unit are respectively coupled to the control unit, wherein the high-side drive unit is coupled to the level shift unit and the high-side switch, and wherein the low-side drive unit is coupled to the low-side switch.

13. The driver chip for a half-bridge circuit as claimed in claim 12, wherein when the second input signal is at a high level or a low level, the control unit switches the high-side switch on or off according to the first input signal, and switches the low-side switch on or off according to the second input signal.

14. The driver chip for a half-bridge circuit as claimed in claim 12, wherein when the second input signal is an analog voltage between a high level and a low level, the decoding unit decodes programming data in the first input signal.

15. The driver chip for a half-bridge circuit as claimed in claim 11, wherein the first input signal is a high-side input signal and the second input signal is a low-side input signal.

16. The driver chip for a half-bridge circuit as claimed in claim 11, wherein the first input signal is a low-side input signal and the second input signal is a high-side input signal.

* * * * *